(12) United States Patent
Wen et al.

(10) Patent No.: US 11,602,063 B2
(45) Date of Patent: Mar. 7, 2023

(54) FLEXIBLE DISPLAY DEVICE AND PORTABLE ELECTRONIC DEVICE

(71) Applicant: Acer Incorporated, New Taipei (TW)

(72) Inventors: Chun-Hung Wen, New Taipei (TW); Chun-Hsien Chen, New Taipei (TW); Hui-Ping Sun, New Taipei (TW); Yen-Chou Chueh, New Taipei (TW)

(73) Assignee: Acer Incorporated, New Taipei (TW)

( * ) Notice: Subject to any disclaimer, the term of this patent is extended or adjusted under 35 U.S.C. 154(b) by 8 days.

(21) Appl. No.: 17/465,798

(22) Filed: Sep. 2, 2021

(65) Prior Publication Data

US 2022/0210930 A1  Jun. 30, 2022

(30) Foreign Application Priority Data

Dec. 31, 2020  (TW) .................................. 109147010

(51) Int. Cl.
*H05K 5/02*  (2006.01)
(52) U.S. Cl.
CPC .................................. *H05K 5/0217* (2013.01)
(58) Field of Classification Search
CPC ...... H05K 5/0217; G06F 1/1652; G09F 9/301
See application file for complete search history.

(56) References Cited

U.S. PATENT DOCUMENTS

| | | | | | |
|---|---|---|---|---|---|
| 7,310,050 | B2* | 12/2007 | Yeh | ........................ | G06F 1/1652 |
| | | | | | 345/905 |
| 7,426,107 | B2* | 9/2008 | Yeh | ..................... | H04M 1/0268 |
| | | | | | 345/170 |
| 7,440,265 | B2* | 10/2008 | Ou Yang | ............... | G06F 1/1652 |
| | | | | | 455/575.4 |
| 9,844,152 | B2* | 12/2017 | Heo | ...................... | H05K 5/0017 |
| 10,082,832 | B1* | 9/2018 | Wang | ...................... | G06F 1/1681 |
| 10,111,344 | B2* | 10/2018 | Han | ...................... | H05K 5/0217 |
| 10,588,223 | B2* | 3/2020 | Han | ...................... | H05K 5/0017 |
| 10,904,371 | B1* | 1/2021 | Song | ...................... | G06F 1/1652 |
| 11,003,207 | B2* | 5/2021 | Kim | ...................... | G06F 1/3278 |
| 11,016,532 | B2* | 5/2021 | Yang | ...................... | G06F 1/1616 |
| 11,032,921 | B2* | 6/2021 | Huang | ................. | H05K 5/0017 |
| 11,042,195 | B1* | 6/2021 | Hong | ...................... | B32B 27/08 |
| 11,051,413 | B2* | 6/2021 | Yang | ...................... | G06F 1/1626 |

(Continued)

FOREIGN PATENT DOCUMENTS

TW    I615820    2/2018

*Primary Examiner* — Anthony M Haughton
*Assistant Examiner* — Theron S Milliser
(74) *Attorney, Agent, or Firm* — JCIPRNET

(57) ABSTRACT

A flexible display device includes: first and second casings; a frame movably assembled to the second casing; and a flexible display having first and second ends opposite to each other and first and second display areas. The second casing is movably assembled to the first casing to form a drawer configuration and slide relative to the first casing to switch between drawn-out and retracted states. The first end is connected to the first casing. The second end to the frame. In the retracted state, the flexible display is bent so the second display area is contained in the first and second casings. In a process from the retracted state to the drawn-out state, the second casing is drawn out from the first casing and drives the frame to move in the same direction to expand and flatten the second display area. A portable electronic device is also provided.

8 Claims, 12 Drawing Sheets

(56) References Cited

U.S. PATENT DOCUMENTS

| | | | |
|---|---|---|---|
| 11,127,323 B2* | 9/2021 | Kim | G06F 1/1641 |
| 11,246,227 B2* | 2/2022 | Han | G09F 9/301 |
| 11,283,910 B2* | 3/2022 | Lee | H04M 1/0268 |
| 11,315,447 B2* | 4/2022 | Feng | G06F 1/1652 |
| 2006/0166713 A1* | 7/2006 | Yeh | G06F 1/1626 |
| | | | 455/575.1 |
| 2006/0176243 A1* | 8/2006 | Yeh | G06F 1/1656 |
| | | | 345/30 |
| 2007/0146243 A1* | 6/2007 | Ou Yang | G06F 1/1601 |
| | | | 345/76 |
| 2017/0013726 A1* | 1/2017 | Han | H05K 5/0217 |
| 2017/0156219 A1* | 6/2017 | Heo | G09F 9/301 |
| 2019/0029131 A1* | 1/2019 | Han | H05K 1/028 |
| 2019/0317550 A1* | 10/2019 | Kim | G06F 1/1694 |
| 2020/0033913 A1* | 1/2020 | Yang | G06F 1/1624 |
| 2020/0170129 A1* | 5/2020 | Han | H05K 7/1427 |
| 2020/0196459 A1* | 6/2020 | Huang | H05K 5/0017 |
| 2020/0337159 A1* | 10/2020 | Yang | G06F 1/1624 |
| 2020/0394942 A1* | 12/2020 | Kim | G06F 1/1652 |
| 2021/0195008 A1* | 6/2021 | Lee | H04M 1/0237 |
| 2021/0263552 A1* | 8/2021 | Kim | G06F 1/1601 |
| 2021/0375165 A1* | 12/2021 | Feng | G09F 9/301 |
| 2022/0124916 A1* | 4/2022 | Han | H05K 7/1427 |
| 2022/0166861 A1* | 5/2022 | Lim | G06F 1/1624 |

* cited by examiner

FLEXIBLE DISPLAY DEVICE AND PORTABLE ELECTRONIC DEVICE

CROSS-REFERENCE TO RELATED APPLICATION

This application claims the priority benefit of Taiwan application serial no. 109147010, filed on Dec. 31, 2020. The entirety of the above-mentioned patent application is hereby incorporated by reference herein and made a part of this specification.

BACKGROUND

Technical Field

The disclosure relates to a flexible display device and a portable electronic device.

Description of Related Art

Through the progress of technology, flexible display technologies have gradually become matured and are considered to have a strong potential for further development. In general, flexible display technologies include electronic papers, flexible OLED, etc. Due to the needs for functions such as bending, folding, expanding, etc., of display devices for portable electronic devices, the applications of flexible display technologies in portable electronic devices are rather versatile. Meanwhile, owing to the applications of flexible materials in the field of electronic displays, electronic display devices are able to display in a larger area when being expanded while occupying a small space or being easy to carry around when folded based on needs.

However, in correspondence with the expanding and folding of the device mechanism in a flexible display device, the flexible display panel of the flexible display device may correspondingly exhibit changes of shape, size, etc., due to its flexible property, which cause wrinkles. Therefore, further efforts are required in developing a mechanism of the flexible display device to meet the technological development trend and market needs.

SUMMARY

Embodiments of the disclosure provide a flexible display device and a portable electronic device capable of coping with the opening/closing needs of a flexible display.

A flexible display device according to an embodiment of the disclosure includes a first casing, a second casing, a frame and a flexible display. The second casing is movably assembled to the first casing to form a drawer configuration, so that the second casing slides relative to the first casing to switch between a drawn-out state and a retracted state. The frame is movably assembled to the second casing. The flexible display has a first end and a second end opposite to each other and includes a first display area and a second display area. The first end is connected to the first casing, and the second end is connected to the frame. In the retracted state, the first display area is exposed by the first casing and the second casing, and the flexible display is bent so that the second display area is contained in the first casing and the second casing. In a process of switching from the retracted state to the drawn-out state, the second casing is drawn out from the first casing and drives the frame to move in a same direction to expand and flatten the second display area. In a process of switching from the drawn-out state to the retracted state, the second casing is retracted to the first casing and drives the frame to move in a same direction to fold the second display area in the first casing and the second casing.

A portable electronic device according to an embodiment of the invention includes a main device and the flexible display device. The flexible display device is pivoted to the main device and adapted be expanded or closed relative to the main device.

In general, when being bent, the inner side surface of a flexible display device tends to be squeezed or wrinkled and consequently damaged. Based on the above, the embodiments of the disclosure provide the flexible display device for such issue. In correspondence with the flexible property of the flexible display, the flexible display device is provided with the first casing, the second casing, and the frame. Two opposite ends of the flexible display are respectively connected to the first casing and the frame. In the process in which the second casing slide relative to the first casing to switch between the drawn-out state and the retracted state, the flexible display is driven by the frame, so that the second display area is contained in the first casing and the second casing or is expanded and flattened. Accordingly, the flexible display device is able to display in a larger area with the first display area and the second display area provided when the second casing is drawn out, and is able to retract the second casing and contain the second display area for the ease of carrying around and to reduce the space occupied.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
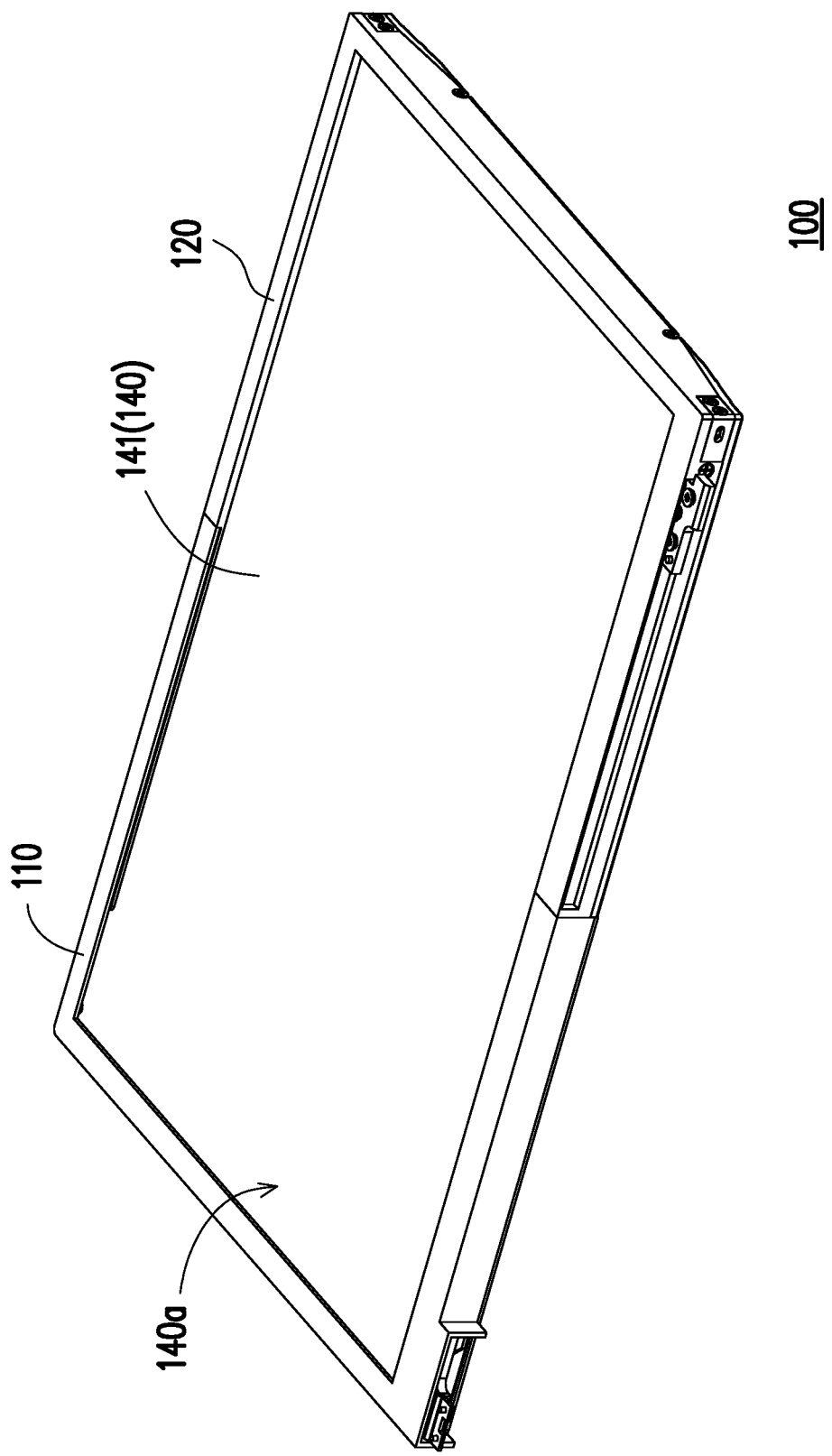
FIG. 1A is a perspective view illustrating a flexible display device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
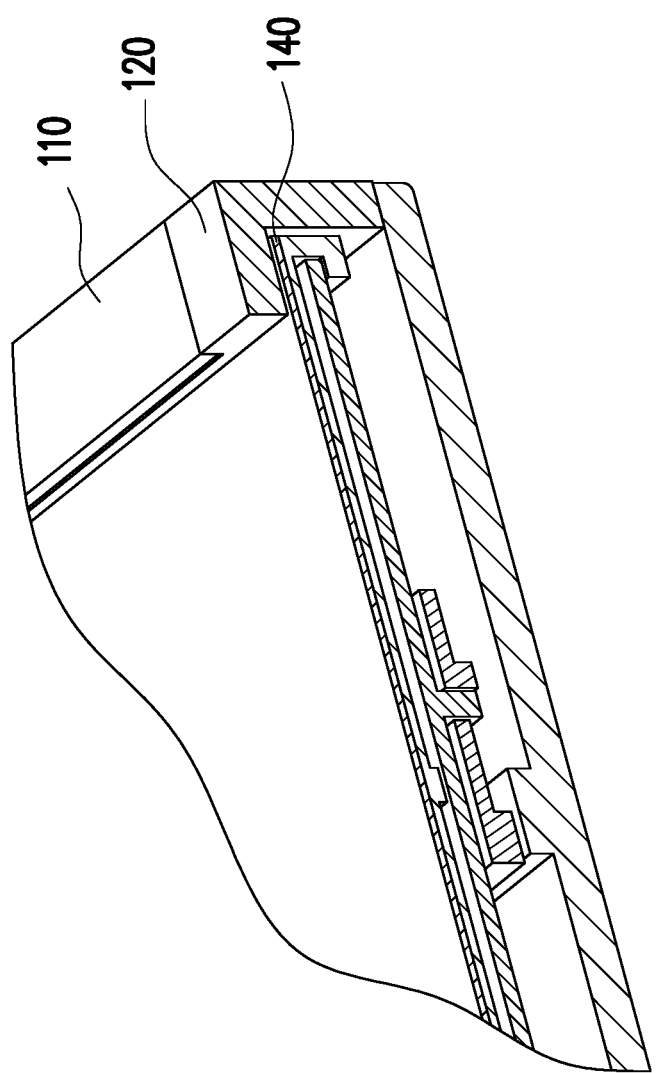
FIG. 1B is a partial cross-sectional view of the flexible display device of FIG. 1A.
Figure 2:
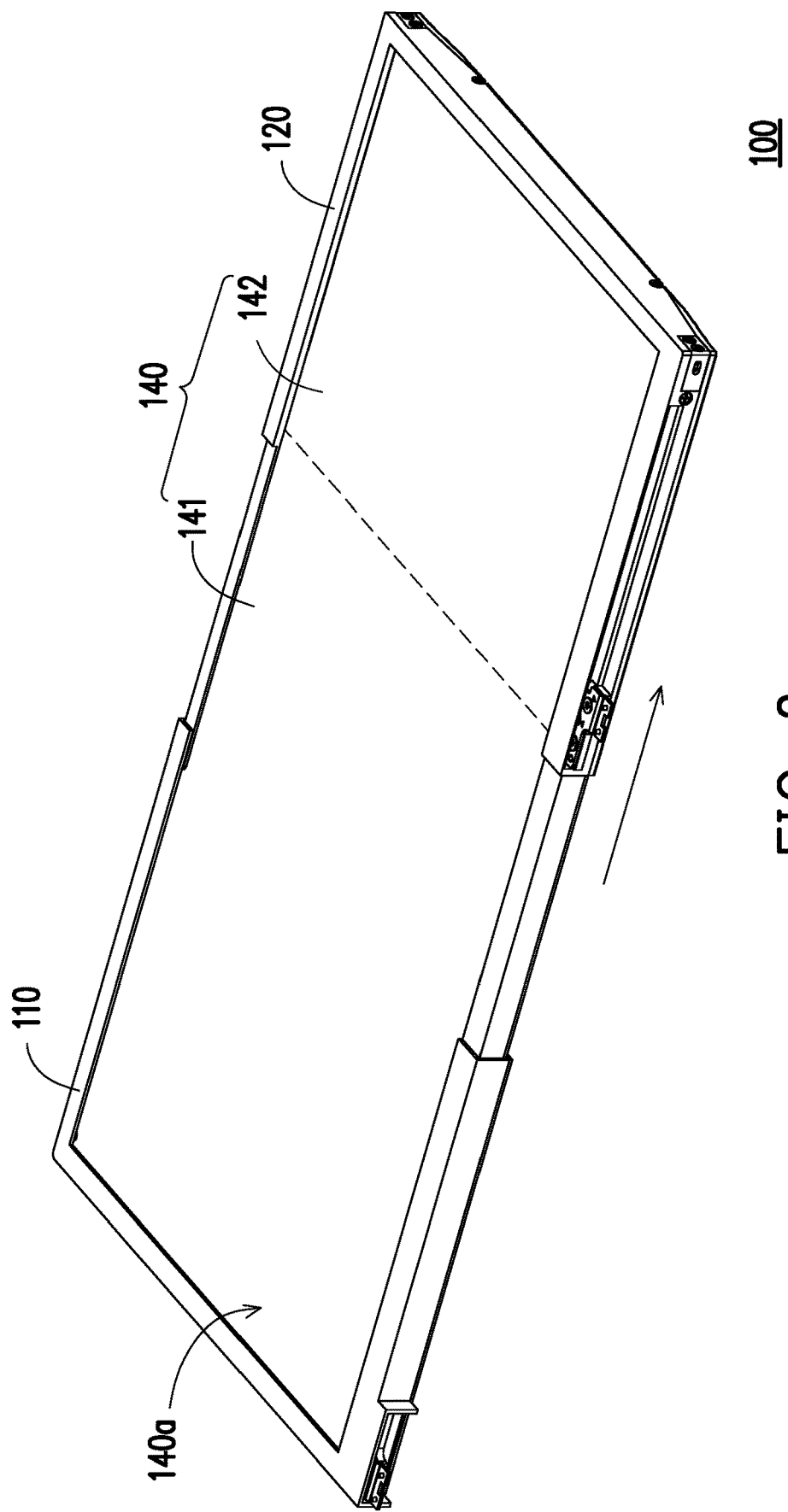
FIG. 2 is a perspective view of the flexible display device of FIG. 1A in a different state.
Figure 3:
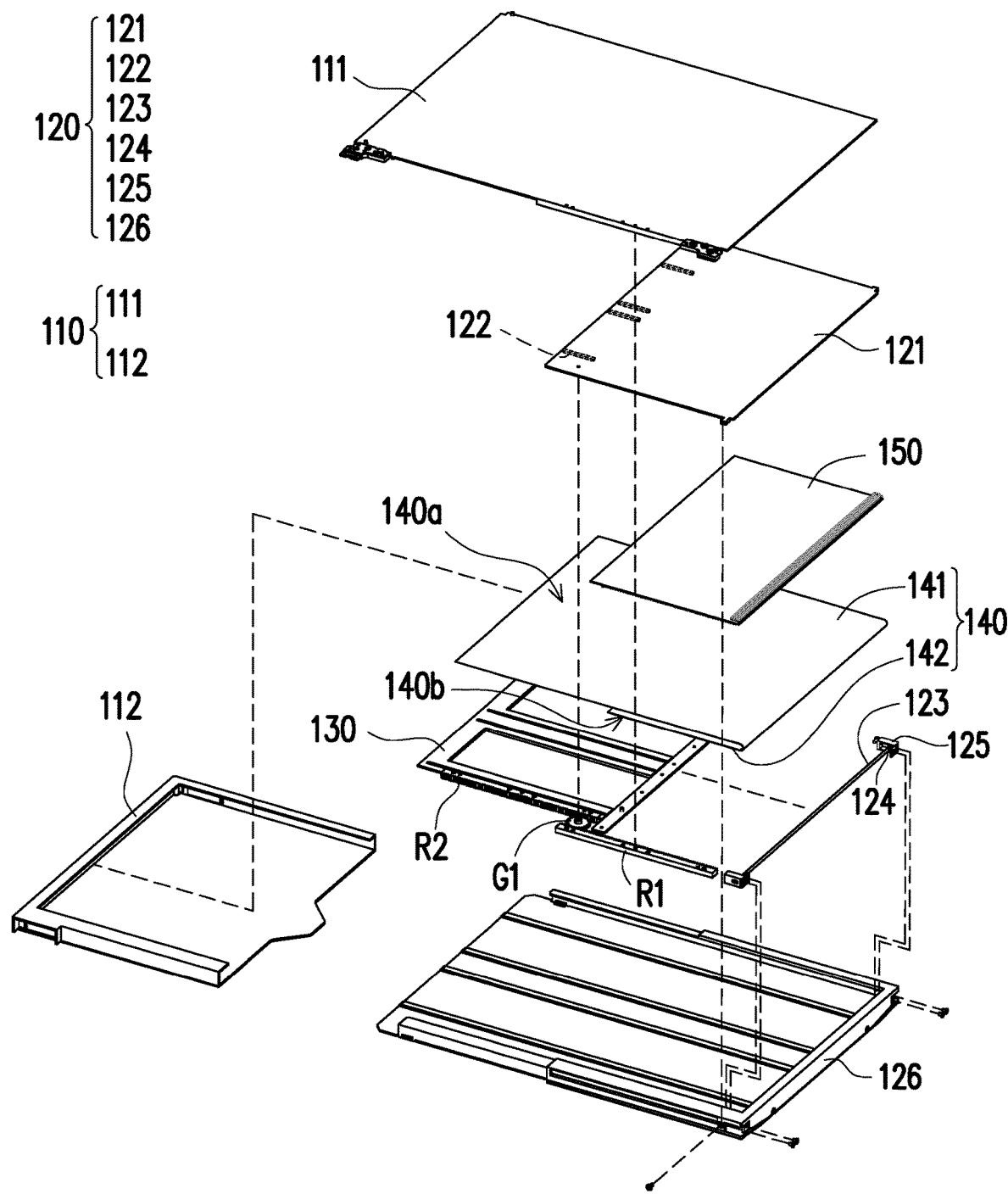
FIG. 3 is an exploded view of the flexible display device of FIG. 1A.

FIG. 1A is a perspective view illustrating a flexible display device according to an embodiment of the disclosure. FIG. 1B is a partial cross-sectional view of the flexible display device of FIG. 1A. FIG. 2 is a perspective view of the flexible display device of FIG. 1A in a different state. FIG. 3 is an exploded view of the flexible display device of FIG. 1A. Referring to FIGS. 1A and 2, in the embodiment, a flexible display device 100 is a mobile phone, a tablet computer, or a display apparatus, for example, and includes a first casing 110, a second casing 120, and a flexible display 140. The second casing 120 is movably assembled to the first casing 110 to form a drawer configuration, so that the second casing 120 slides relative to the first casing 110 to switch between a retracted state shown in FIG. 1A and a drawn-out state shown in FIG. 2.

Referring to FIG. 3, in the embodiment, the flexible display device 100 further includes a frame 130. The frame 130 is movably assembled to the second casing 120. The second casing 120 includes a bottom plate 121, and the frame 130 is floatingly disposed on the bottom plate 121. In the embodiment, the flexible display 140 has a first end 140a and a second end 140b opposite to each other and includes a first display area 141 and a second display area 142. The first end 140a is connected to the first casing 110, and the second end 140b is connected to the frame 130.

In the retracted state shown in FIG. 1A, the first display area 141 is exposed by the first casing 110 and the second casing 120, and the flexible display 140 is bent so that the second display area 142 is contained in the first casing 110 and the second casing 120. In the process of switching from the retracted state shown in FIG. 1A to the drawn-out state shown in FIG. 2, the second casing 120 is drawn out from the first casing 110 and drives the frame 130 to move in the same direction, so as to expand and flatten the second display area 142. Accordingly, the first display area 141 and the second display area 142 are located on the same plane and exposed by the first casing 110 and the second casing 120.

In the process of switching from the drawn-out state shown in FIG. 2 to the retracted state shown in FIG. 1A, the second casing 120 is retracted to the first casing 110 and drives the frame 130 to move in the same direction to fold the second display area 142 in the first casing 110 and the second casing 120. With the flexible display device 100 being drawn out or retracted like a drawer, the portability and applicability thereof can be facilitated. Meanwhile, the operability thereof is also facilitated.

With such configuration, since the flexible display 140 is pressed and limited in a top-down manner by the frame of the second casing 120, the flexible display 140 is expanded in a single direction in the process where the second casing 120 is drawn out. In the embodiment, the second casing 120 of the flexible display device 100 is adapted to be pulled rightward for a larger display area. In other embodiments not shown herein, the flexible display device may be adapted to be pulled rightward and leftward for a larger display area by adopting a mechanism similar to the mechanism described above for a larger display area.

Referring to FIG. 3, in the embodiment, the first casing 110 includes a first sub-casing 111 and a second sub-casing 112. The second casing 112 includes the bottom plate 121 and a third sub-casing 126. The flexible display device 100 includes a gear G1, a first gear rack R1, and a second gear rack R2. The gear G1 is pivoted to the bottom plate 121. The first gear rack R1 is disposed on the first sub-casing 111. The second gear rack R2 is disposed on the frame 130 and parallel to the first gear rack R1. The gear G1 is engaged between the first rack R1 and the second rack R2.

Figure 4A:
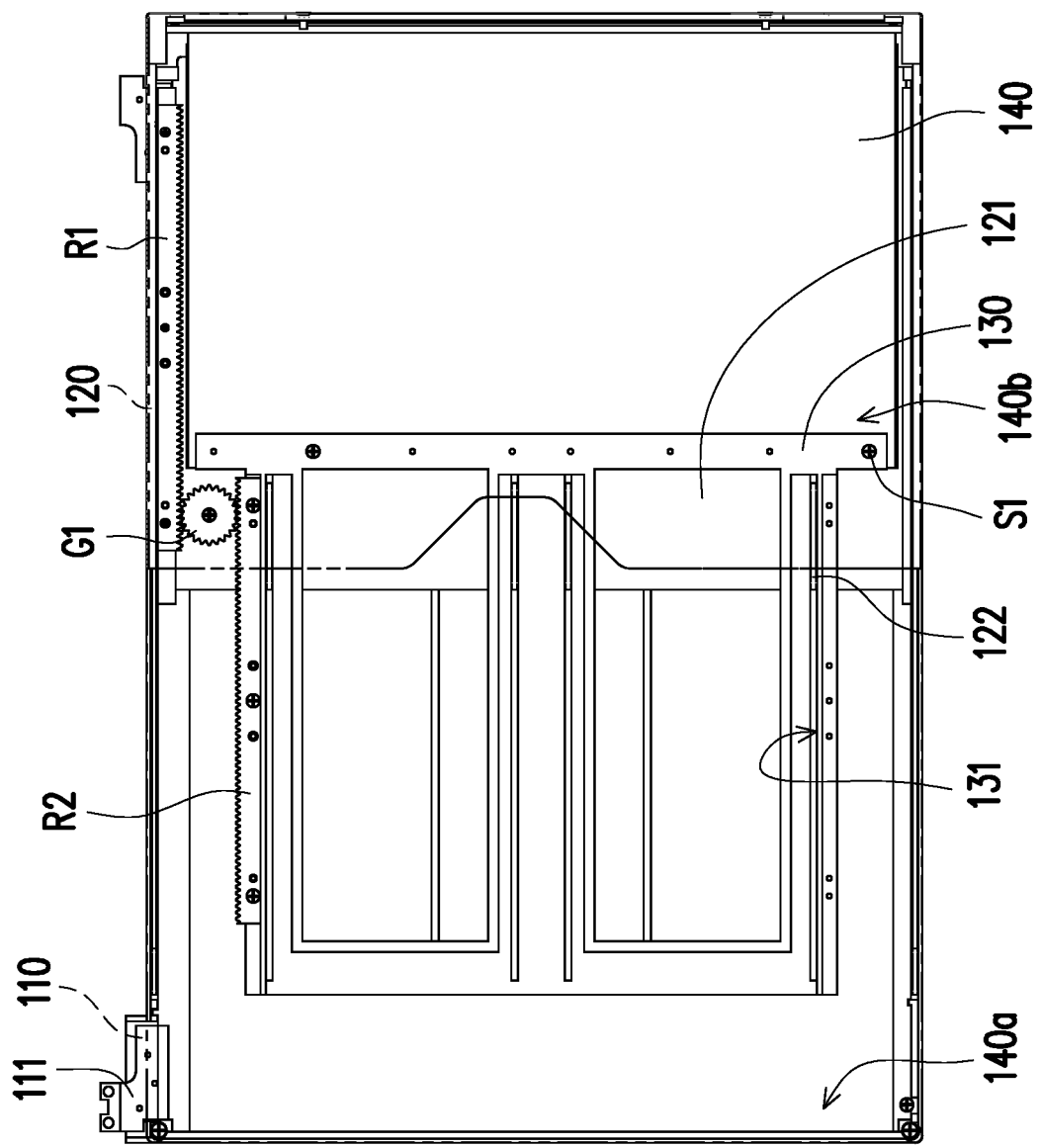
FIG. 4A is a bottom view of the flexible display device of FIG. 1A.
Figure 4B:
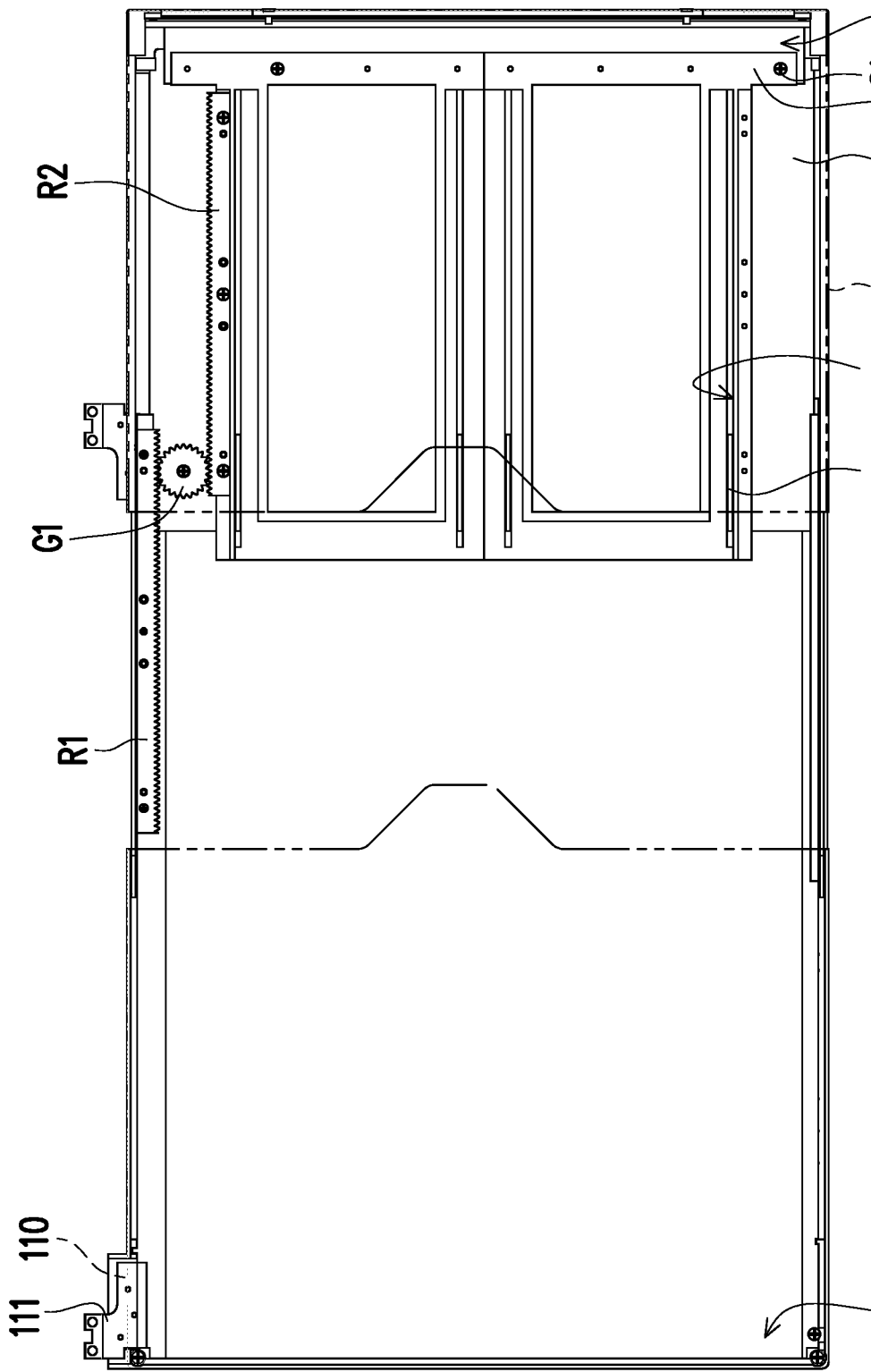
FIG. 4B is a bottom view of the flexible display device of FIG. 2.

FIG. 4A is a bottom view of the flexible display device of FIG. 1A. FIG. 4B is a bottom view of the flexible display device of FIG. 2. For clearer illustration, the appearance components of the flexible display device 100 are omitted. In addition, the first casing 110 and the second casing 120 of FIG. 1A are shown in broken lines in FIGS. 4A and 4B.

In the process of switching from the retracted state shown in FIG. 4A to the drawn-out state shown in FIG. 4B, the gear G1 follows the second casing 120 to move relative to the first casing 110 and the first gear rack R1. In addition, the gear G1 is rotated through engagement with the first gear rack R1, and the rotation drives the frame 130 through the engagement between the gear G1 and the second gear rack R2. Accordingly, the frame 130 moves in the same direction with the second casing 120. The traveling stroke of the frame 130 is shorter than the traveling stroke of the second casing 120. In the embodiment, in the process of switching from the retracted state shown in FIG. 4A to the drawn-out state shown in FIG. 4B, the first end 140a and the second end 140b of the flexible display 140 become distant from each other. In the process of switching from the drawn-out state shown in FIG. 4B to the retracted state shown in FIG. 4A, the first end 140a and the second end 140b of the flexible display 140 are moved toward each other.

Figure 4C:
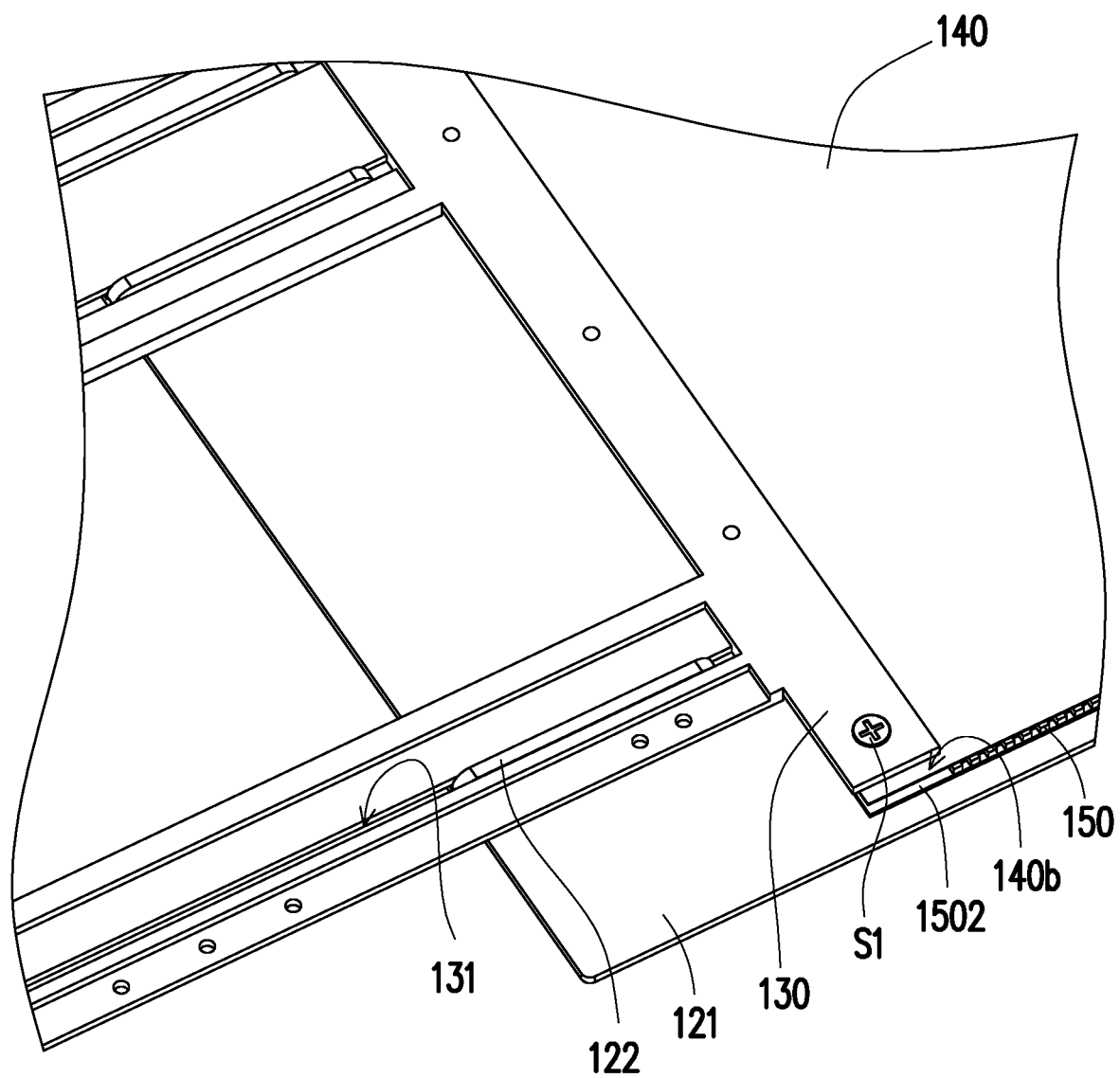
FIG. 4C is a partial schematic view of the flexible display device of FIG. 4A from another perspective.

FIG. 4C is a partial schematic view of the flexible display device of FIG. 4A from another perspective. For clearer illustration, the first casing 110 and the second casing 120 of FIG. 1 are not shown in FIG. 4C. Referring to FIGS. 3 and 4C, in the embodiment, the second casing 120 includes at least one rib 122. The rib 122 is disposed on the bottom plate 121 and parallel to the first gear rack R1. The frame 130 has at least one guiding groove 131. The guiding groove 131 is parallel to the first gear rack R1. The rib 122 and the guiding groove 131 are slidably coupled to each other, so that the frame 130 is more stable when operating with the second casing 120.

In the embodiment, the flexible display device 100 includes a support chain plate 150. As shown in FIG. 4C, in the embodiment, a locking screw S1 is provided to screw-lock the frame 130, the second end 140b of the flexible display 140, and an end part 1502 of the support chain plate 150. In addition, the locking screw S1 leans against the bottom plate 121. Accordingly, the support chain plate 150 may movably lean against the bottom plate through a gap formed between the frame 130 and the bottom plate 121 by using the locking screw S1.

Figure 5A:
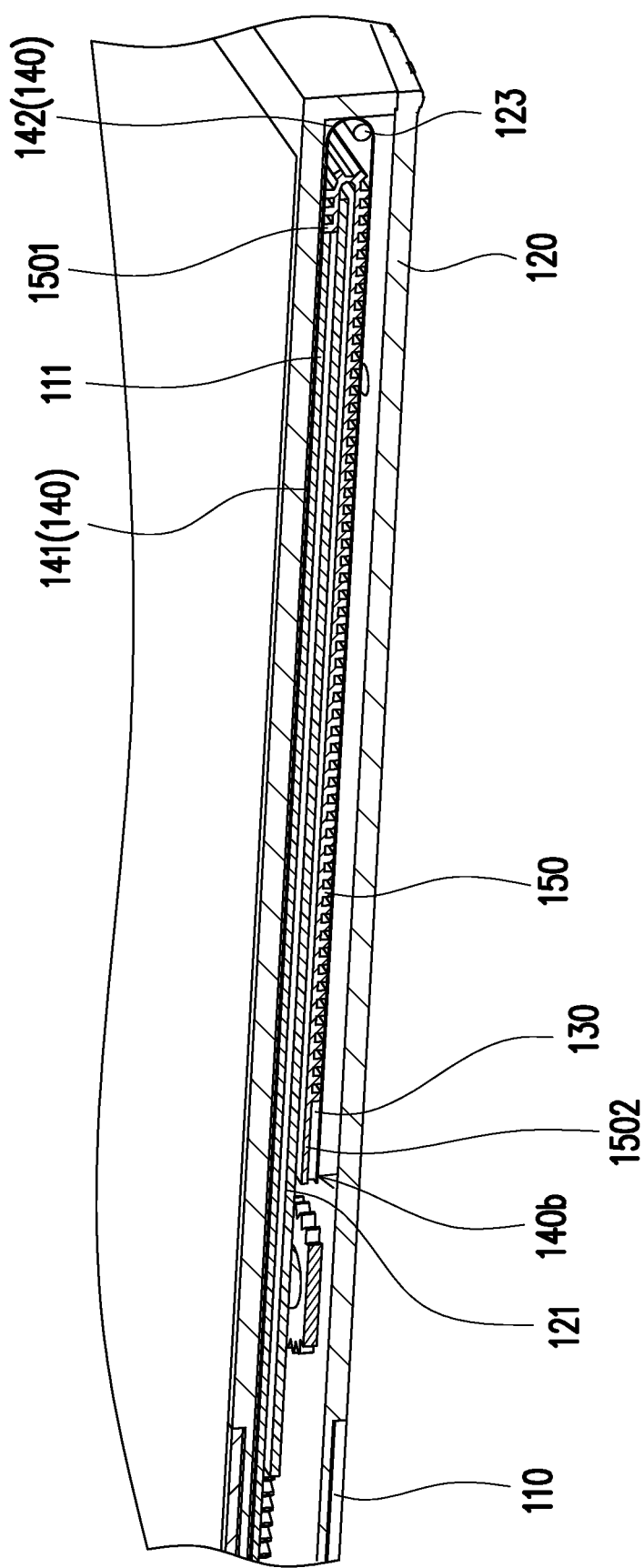
FIG. 5A is a partial cross-sectional view of the flexible display device of FIG. 1A.
Figure 5B:
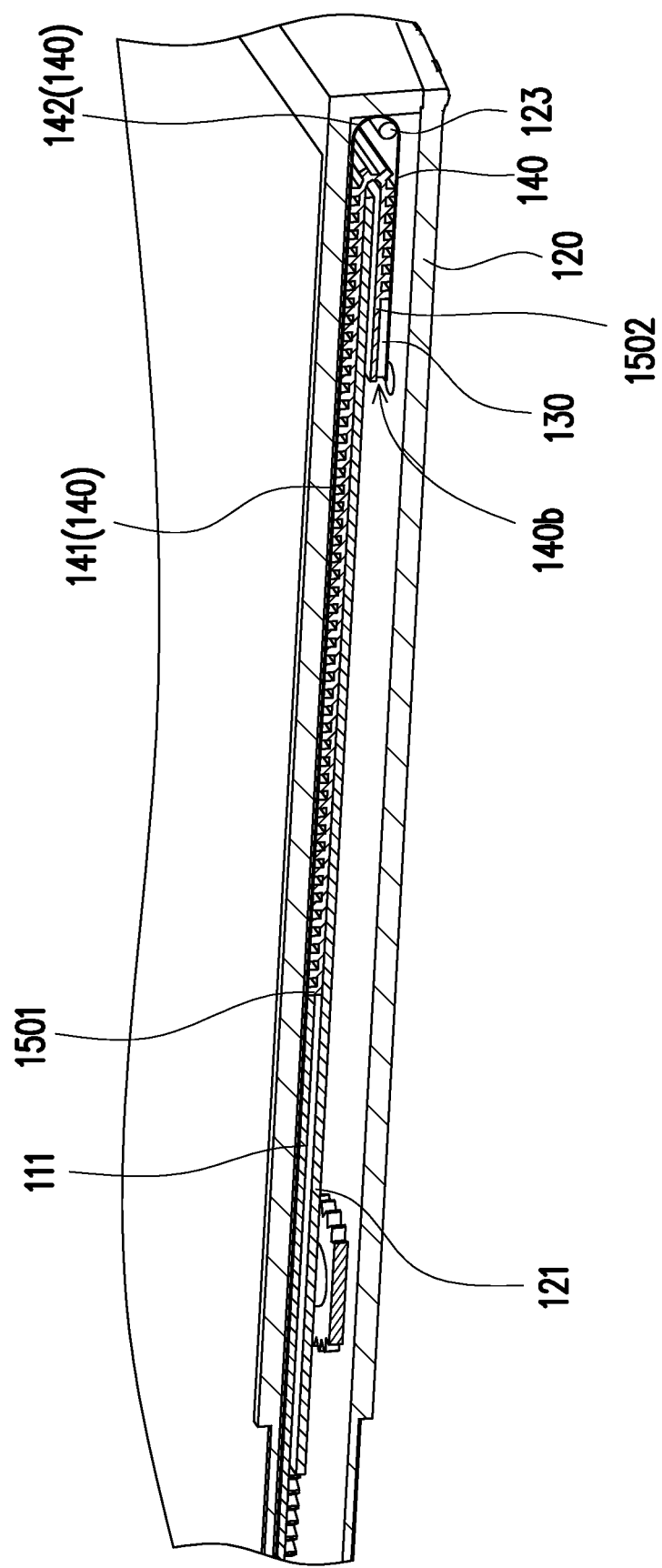
FIG. 5B is a partial perspective view of the flexible display device of FIG. 2.
Figure 6:
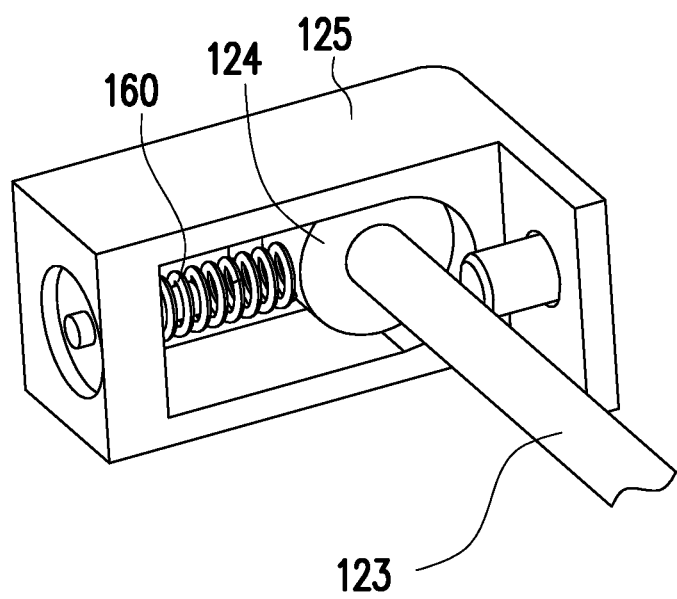
FIG. 6 a schematic view of some components of the flexible display device of FIG. 3.

FIG. 5A is a partial cross-sectional view of the flexible display device of FIG. 1A. FIG. 5B is a partial perspective view of the flexible display device of FIG. 2. FIG. 6 a schematic view of some components of the flexible display device of FIG. 3. As shown in FIGS. 4C, 5A, and 5B, the end part 1502 of the support chain plate 150 is fixed with the second end 140b of the flexible display 140 to the frame 130. As shown in FIGS. 4C, 5A, and 5B, another end part 1501 of the support chain plate 150 is fixed to the first sub-casing 111 of the first casing 110.

In addition, referring to FIG. 3, in the embodiment, the second casing 120 includes a support rod 123 perpendicular to the gear rack R1. As shown in FIGS. 5A and 5B, the support rod 123 is located between the flexible display 140 and the support chain plate 150. The first display area 141 and the second display area 142 are located on the outer surface of the flexible display 140, and the support rod 123 abuts against the inner surface of the flexible display 140.

Specifically, referring to FIGS. 3 and 6, the second casing 120 further includes two position-limiting parts 125 and two bearings 124. The two position-limiting parts 125 are respectively located on two sides of the second casing 120. The bearing 124 is slidably located in the position-limiting part 125. Two end parts of the support rod 123 are respectively disposed at the corresponding bearings 124. The flexible display device 100 includes two elastic members 160 respectively disposed in the two position-limiting parts 125 of the second casing 120. In addition, the elastic member 160 is pressed against the bearing 124 to allow the support rod 123 to maintain the abutting relationship with the inner surface of the flexible display 140.

With such design, the support rod 123 is able to prevent the flexible display 140 from being squeezed, wrinkled, etc., due to a stroke difference during the retracting process of the second casing 120. The stroke difference here means that, from a microscopic perspective, the retracting stroke of the flexible display 140 may fall behind the retracting stroke of the second casing due to gaps between the gear G1 and the gear racks R1 and R2. As described above, the flexible property of the flexible display 140 may exhibit changes of shape, size, etc., due to different states thereof. In order for the mechanism stroke of the device mechanism (e.g., the first casing 110 and the second casing 120) to meet the deformation amount of the flexible display 140, the first casing 110 and the second casing 120 which are relatively movable are provided in the embodiment, and the support rod 123 is used with the bearings 124 and the elastic members 160 to support the flexible display 140. Accordingly, the flexible display 140 may be tightened due to tensile force to meet the needs.

Figure 7A:
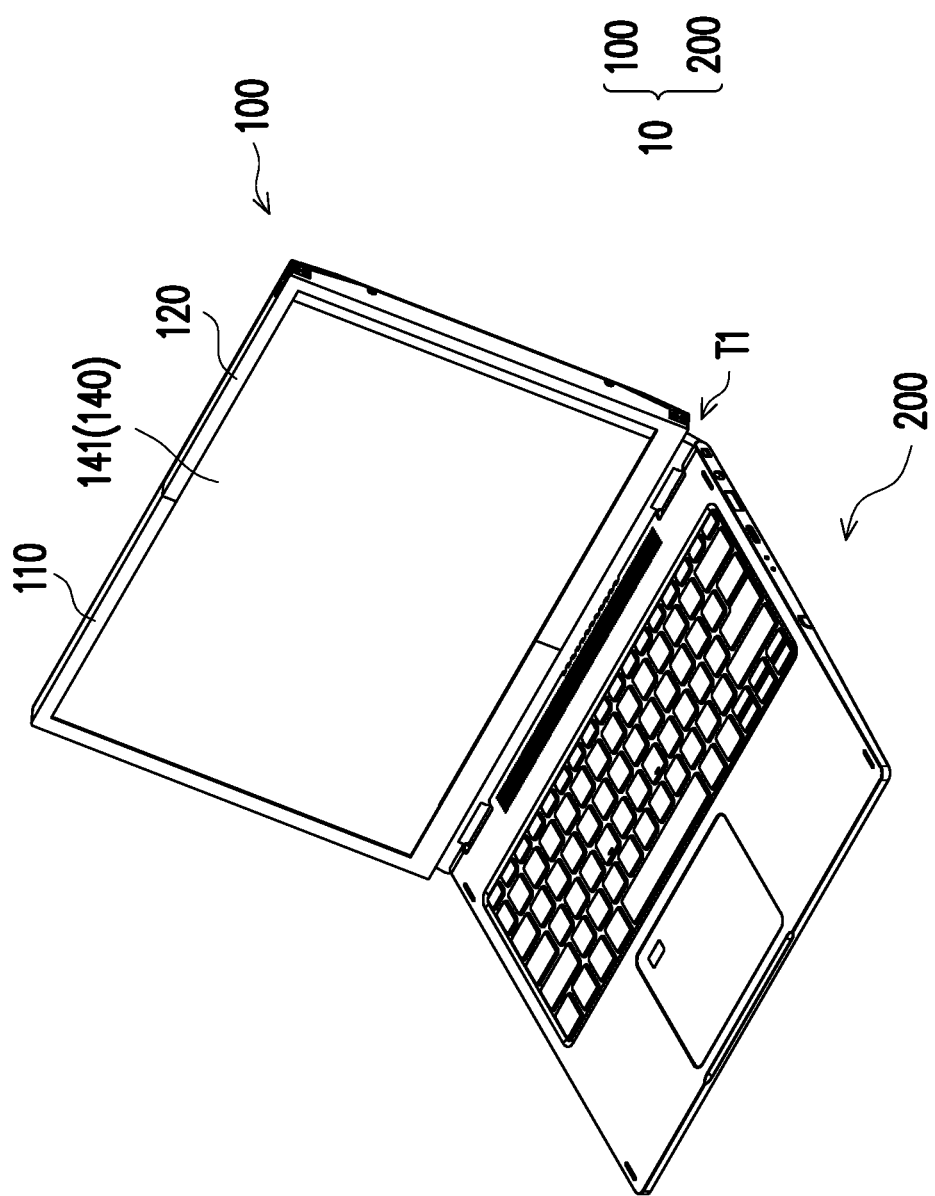
FIGS. 7A and 7B are respectively perspective views of different states of a portable electronic device according to an embodiment of the disclosure.
Figure 7B:
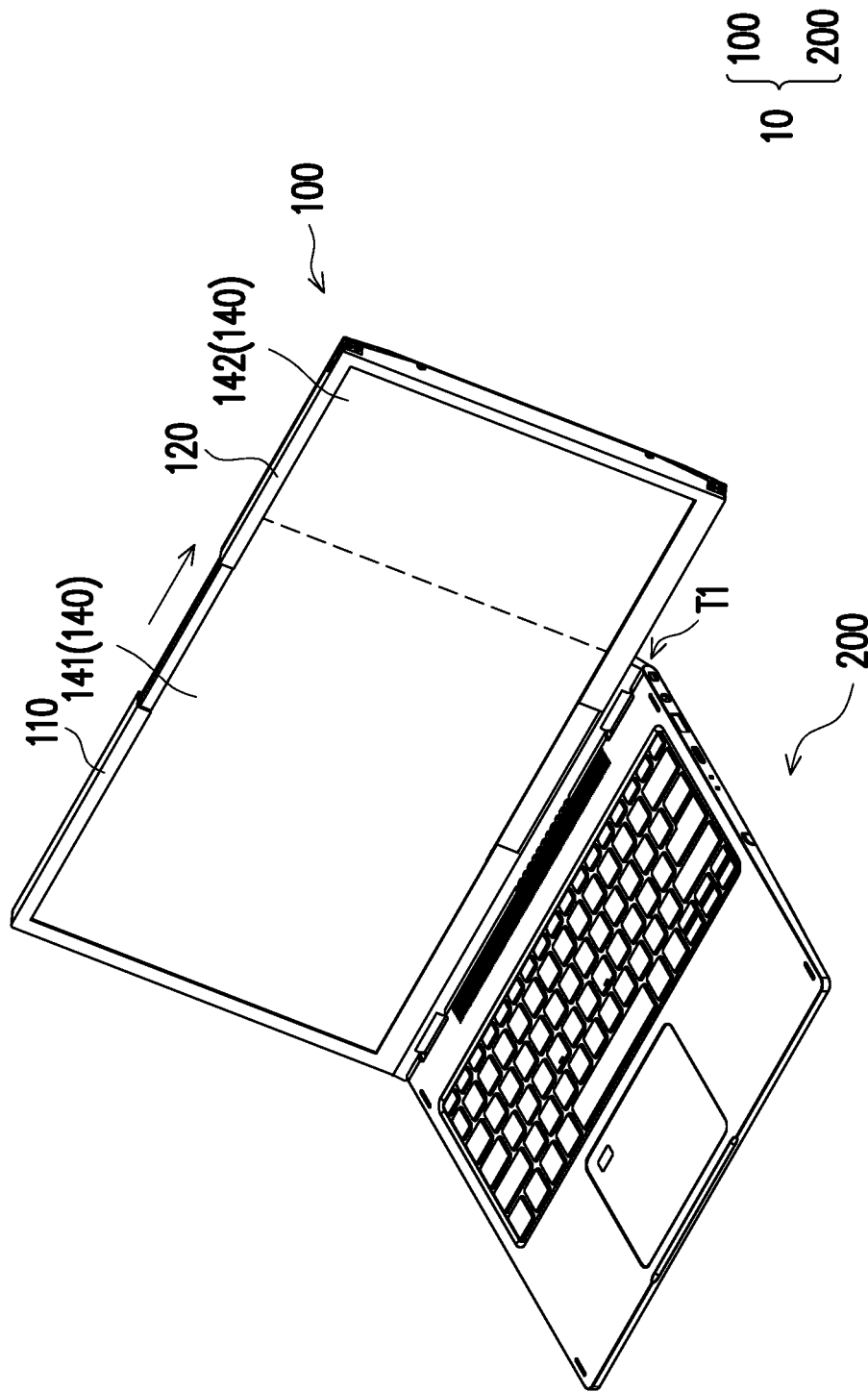

FIGS. 7A and 7B are respectively perspective views of different states of a portable electronic device according to an embodiment of the disclosure. In the embodiment, a portable electronic device 10 includes a main device 200 and the flexible display device 100. The flexible display device 100 is pivoted to the main device 200 via a pivot part T1, so as to be expanded or closed relative to the main device 200. When the flexible display device 100 is expanded relative to the main device 200, the second casing 120 is adapted to slide relative to the first casing 110 to switch between the drawn-out state and the retracted state.

In view of the foregoing, in the embodiments of the disclosure, in correspondence with the flexible property of the flexible display, the flexible display device is provided with the first casing, the second casing, and the frame. In the process in which the second casing slide relative to the first casing to switch between the drawn-out state and the retracted state, the second display area is contained in the first casing and the second casing or is expanded and flattened. Consequently, the second display area may provide a larger display area when being drawn out and may be retracted for the convenience of being carried around or to reduce the space occupied.

Since the flexible display is pressed and limited in a top-down manner by the frame of the second casing, the flexible display is expanded in a single direction in the process where the second casing is drawn out. In other embodiments, the flexible display device may be pulled rightward and leftward for a larger display area. As described above, the flexible property of the flexible display may exhibit changes of shape, size, etc., due to different states thereof. In order for the mechanism stroke of the device mechanism (e.g., the first casing and the second casing) to meet the deformation amount of the flexible display, the first casing and the second casing which are relatively movable are provided and used with the frame in the embodiments of the disclosure to meet the needs.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A flexible display device, comprising:
   a first casing;
   a second casing, movably assembled to the first casing to form a drawer configuration, so that the second casing slides relative to the first casing to switch between a drawn-out state and a retracted state;
   a frame, movably assembled to the second casing; and
   a flexible display, having a first end and a second end opposite to each other and comprising a first display area and a second display area, wherein the first end is connected to the first casing, and the second end is connected to the frame, wherein in the retracted state, the first display area is exposed by the first casing and the second casing, and the flexible display is bent so that the second display area is contained in the first casing and the second casing, in a process of switching from the retracted state to the drawn-out state, the second casing is drawn out from the first casing and drives the frame to move in a same direction to expand and flatten the second display area, and in a process of switching from the drawn-out state to the retracted state, the second casing is retracted to the first casing and drives the frame to move in a same direction to fold the second display area in the first casing and the second casing;
   the flexible display device further comprising;
   a support chain plate, wherein one end of the support chain plate is fixed to the first casing, and another end of the support chain plate is fixed with the second end of the flexible display to the frame;
   wherein the second casing comprises a support rod located between the flexible display and the support chain plate and abutting against an inner surface of the flexible display, and the first display area and the second display area are located on an outer surface of the flexible display;
   wherein the second casing further comprises two bearings, and two end parts of the support rod are respectively arranged at the bearings; and
   two elastic members, disposed in the second casing and pressed against the bearings, so that the support rod maintains an abutting relationship with the flexible display.

2. The flexible display device as claimed in claim 1, further comprising:
   a gear, pivoted to the second casing;
   a first gear rack, disposed in the first casing; and
   a second rack, disposed in the frame, wherein the gear is engaged between the first gear rack and the second gear rack, and in the processes of switching between the drawn-out state and the retracted state, the gear follows the second casing to move relatively to the first casing and the first gear rack, the gear is rotated through engagement with the first gear rack, and the rotation drives the frame through engagement between the gear the second gear rack, so that the frame and the second casing move in the same direction.

3. The flexible display device as claimed in claim 2, wherein a traveling stroke of the frame is smaller than a traveling stroke of the second casing.

4. The flexible display device as claimed in claim 2, wherein the second casing comprises a bottom plate and at least one rib, the gear is pivoted to the bottom plate, the rib is disposed on the bottom plate, the frame has at least one guiding groove, and the rib and the guiding groove are slidably coupled to each other.

5. The flexible display device as claimed in claim 4, wherein the frame is floatingly disposed on the bottom plate.

6. The flexible display device as claimed in claim 4, wherein in the process of switching from the retracted state to the drawn-out state, the first end and the second end of the flexible display become distant from each other, and in the process of switching from the drawn-out state to the retracted state, the first end and the second end of the flexible display are moved toward each other.

7. A portable electronic device, comprising:
  a main device; and
  the flexible display device as claimed in claim 1, pivoted to the main device and adapted to be expanded or closed relative to the main device.

8. The portable electronic device as claimed in claim 7, wherein when the flexible display device is expanded relative to the main device, the second casing is adapted to slide relative to the first casing to switch between the drawn-out state and the retracted state.

\* \* \* \* \*